United States Patent
Zhang et al.

(10) Patent No.: US 11,423,825 B2
(45) Date of Patent: Aug. 23, 2022

(54) FUNCTIONAL PANEL, METHOD FOR MANUFACTURING THE SAME AND TERMINAL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Ying Zhang, Beijing (CN); Xianyong Gao, Beijing (CN); Sijun Lei, Beijing (CN); Yunsong Li, Beijing (CN); Shanbin Chen, Beijing (CN); Bo Ran, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 16/642,044

(22) PCT Filed: Jul. 26, 2019

(86) PCT No.: PCT/CN2019/097879
§ 371 (c)(1),
(2) Date: Feb. 26, 2020

(87) PCT Pub. No.: WO2020/020336
PCT Pub. Date: Jan. 30, 2020

(65) Prior Publication Data
US 2021/0064103 A1 Mar. 4, 2021

(30) Foreign Application Priority Data

Jul. 27, 2018 (CN) .......................... 201810848255.1
Nov. 26, 2018 (CN) .......................... 201811415511.4

(51) Int. Cl.
*G09G 3/20* (2006.01)
*G02F 1/1333* (2006.01)
(Continued)

(52) U.S. Cl.
CPC ....... *G09G 3/2096* (2013.01); *G02F 1/13338* (2013.01); *G02F 1/136286* (2013.01);
(Continued)

(58) Field of Classification Search
CPC .... G09G 3/2092–2096; G09G 2370/14; G06F 3/04164
See application file for complete search history.

(56) References Cited

U.S. PATENT DOCUMENTS 8,044,746 B2 * 10/2011 Blair ...................... H01P 3/006
333/5
2008/0129713 A1 6/2008 Chen et al.
(Continued)

FOREIGN PATENT DOCUMENTS

CN 101197114 A 6/2008
CN 101295809 10/2008
(Continued)

OTHER PUBLICATIONS

Office action from Chinese Application No. 201910002796.7 dated May 27, 2020.
(Continued)

*Primary Examiner* — Sanjiv D. Patel
(74) *Attorney, Agent, or Firm* — Calfee, Halter & Griswold LLP

(57) ABSTRACT

A functional panel, a method of manufacturing the same, and a terminal are disclosed. The functional panel includes
(Continued)

a base substrate, at least one differential signal line group on the base substrate, where each differential signal line group of the at least one differential signal line group includes two signal lines and at least one ground line group on the base substrate and on the same side of the base substrate as the at least one differential signal line group. Each ground line group of the at least one ground line group includes two ground lines. Each ground line group corresponds to each differential signal line group one-to-one, and orthographic projections of the two ground lines in each ground line group on the base substrate are on both sides of an orthographic projection of a corresponding differential signal line group on the base substrate, and two ground lines in the ground line group are connected to a same reference ground.

15 Claims, 13 Drawing Sheets

(51) Int. Cl.
| | |
|---|---|
| *G02F 1/1362* | (2006.01) |
| *G06F 3/041* | (2006.01) |
| *H01L 27/32* | (2006.01) |
| *H01L 51/56* | (2006.01) |
| *H04L 1/00* | (2006.01) |
| *H04B 10/2569* | (2013.01) |
| *H04L 1/20* | (2006.01) |
| *G06F 1/18* | (2006.01) |
| *H05K 1/02* | (2006.01) |
| *G06F 30/39* | (2020.01) |
| *H04L 25/02* | (2006.01) |

(52) U.S. Cl.
CPC ............ *G06F 1/189* (2013.01); *G06F 3/0412* (2013.01); *G06F 30/39* (2020.01); *H01L 27/323* (2013.01); *H01L 27/3276* (2013.01); *H01L 51/56* (2013.01); *H04B 10/2569* (2013.01); *H04L 1/00* (2013.01); *H04L 1/203* (2013.01); *H05K 1/0245* (2013.01); *G06F 2203/04103* (2013.01); *G09G 2310/08* (2013.01); *G09G 2320/06* (2013.01); *G09G 2330/06* (2013.01); *G09G 2370/06* (2013.01); *G09G 2370/08* (2013.01); *G09G 2370/10* (2013.01); *H01L 2223/6638* (2013.01); *H01L 2227/323* (2013.01); *H04L 25/0272* (2013.01); *H05K 2201/09227* (2013.01); *H05K 2201/09727* (2013.01); *H05K 2201/09736* (2013.01)

(56) References Cited

U.S. PATENT DOCUMENTS

| | | |
|---|---|---|
| 2009/0207367 A1 | 8/2009 | Oohira |
| 2014/0078133 A1 | 3/2014 | Lee et al. |
| 2017/0132966 A1 | 5/2017 | Lim et al. |
| 2018/0120616 A1* | 5/2018 | Kanou .................. G06F 3/0412 |

FOREIGN PATENT DOCUMENTS

| | | |
|---|---|---|
| CN | 101516160 | 8/2009 |
| CN | 102867488 A | 1/2013 |
| TW | 201413677 A | 4/2014 |
| WO | 2018003332 | 1/2018 |

OTHER PUBLICATIONS

Office action from Chinese Application No. 201910002796.7 dated Oct. 23, 2020.

* cited by examiner

FUNCTIONAL PANEL, METHOD FOR MANUFACTURING THE SAME AND TERMINAL

RELATED APPLICATIONS

The present application is a 35 U.S.C. 371 national stage application of a PCT International Application No. PCT/CN2019/097879, filed on Jul. 26, 2019, which claims the benefits of Chinese Patent Application NO. 201810848255.1 entitled "Anti-interference method for signal transmission, signal transmission device and display device", filed on Jul. 27, 2018 and Chinese Patent Application NO. 201811415511.4 entitled "Functional panel, method for manufacturing the same and terminal", filed on Nov. 26, 2018, the contents of which are incorporated herein by reference in their entireties.

TECHNICAL FIELD

The present disclosure relates to the field of electronic technology applications, and in particular, to a functional panel, a method for manufacturing the same, and a terminal.

BACKGROUND

Display devices may generally comprise a display panel and a panel driving circuit for driving the display panel. The panel driving circuit may comprise a timing controller (T/CON), a gate driving circuit, and a source driving circuit. The gate driving circuit comprises a plurality of gate driver chips, and the source driving circuit comprises a plurality of source driver chips.

With improvements of the resolution of the display panels, the amount of data to be transmitted also increases significantly. In a panel driving circuit, a high-speed differential signal is usually transmitted through a differential signal line group (also called a high-speed differential signal line group). A differential signal line group is actually a signal line group consisting of two signal lines, and its data transmission rate is relatively high.

SUMMARY

According to an exemplary embodiment, there is provided a functional panel, comprising:
  a base substrate;
  at least one differential signal line group on the base substrate, and each differential signal line group of the at least one differential signal line group comprising two signal lines;
  at least one ground line group on the base substrate and on a same side of the base substrate as the at least one differential signal line group, each ground line group of the at least one ground line group comprising two ground lines.

Each ground line group corresponds to each differential signal line group one-to one, and orthographic projections of the two ground lines in each ground line group on the base substrate are on both sides of an orthographic projection of a corresponding differential signal line group on the base substrate, and two ground lines in the ground line group are connected to a same reference ground.

In some exemplary embodiments, the two ground lines in the ground line group comprise a first ground line and a second ground line and at least one end of the first ground line and at least one end of the second ground line are connected to the same reference ground.

In some exemplary embodiments, a first end of the first ground line and a first end of the second ground line are connected to the same reference ground; a second end of the first ground line and a second end of the second ground line are connected to the same reference ground, and the first end and the second end are two opposite ends in an extending direction of the first ground line or the second ground line.

In some exemplary embodiments, the at least one differential signal line group comprises a plurality of differential signal line groups arranged in an array, and the at least one ground line group comprises a plurality of ground line groups arranged in an array, and two adjacent ground line groups of the plurality of ground line groups multiplex a same ground line.

In some exemplary embodiments, the functional panel further comprises a reference ground layer and an insulation layer sequentially stacked in a direction away from the base substrate. The at least one ground line group is on a side of the insulation layer away from the reference ground layer, a plurality of vias are provided in the insulation layer, and the at least one ground line group is connected to the reference ground layer through the plurality of vias in the insulation layer.

In some exemplary embodiments, at least one via is provided in each of the two ground lines in each ground line group, the at least one via is configured to connect to the reference ground and respective one of the at least one via corresponds with respective one of the plurality of vias in the insulation layer.

In some exemplary embodiments, the at least one via comprises a plurality of vias arranged at equal intervals.

In some exemplary embodiments, the first end of the first ground line and the first end of the second ground line are connected through a first lead, and the first lead is connected to the reference ground layer through the plurality of vias in the insulation layer; and the first end and the second end are two opposite ends in the extending direction of the first ground line or the second ground line.

In some exemplary embodiments, the second end of the first ground line and the second end of the second ground line are connected through a second lead, and the second lead is connected to the reference ground layer through the plurality of vias in the insulation layer; and the first end and the second end are two opposite ends in the extending direction of the first ground line or the second ground line.

In some exemplary embodiments, the functional panel further comprises:
  at least one bonding pad;
  at least one driver chip;
  the at least one bonding pad is connected to the at least one driver chip through the at least one differential signal line group, at least one ground line group is between the at least one bonding pad and the at least one driver chip, and respective one of the at least one ground line group corresponds to respective one of the at least one differential signal line group.

In some exemplary embodiments, each driver chip of the at least one driver chip comprises one ground pad and two signal pads. The ground pad is on a side of the two signal pads, and the two signal pads are configured to be respectively connected to two signal lines in a corresponding differential signal line group, and
  the first ground line is directly connected to the ground pad.

In some exemplary embodiments, the second ground line is connected to the ground pad through a third lead that is insulated from both the two signal lines, and an orthographic projection of the third lead on the base substrate crosses orthographic projections of the two signal lines on the base substrate.

In some exemplary embodiments, each driver chip comprises a first ground pad, a second ground pad, and two signal pads. The first ground pad and the second ground pad are on both sides of the two signal pads, respectively, and the two signal pads are configured to be respectively connected to two signal lines in a corresponding differential signal line group, and the first ground line is connected to the first ground pad, and the second ground line is connected to the second ground pad.

In some exemplary embodiments, the third lead is on a side of the differential signal line group away from the base substrate and laps over the two signal lines, and an insulating spacer is provided at a lap-joint between the third lead and the two signal lines.

In some exemplary embodiments, the third lead and the ground line group are at different layers, and an isolation layer for insulation is provided between the third lead and the ground line group, and both ends of the third lead are connected to the first ground line and the second ground line through vias in the isolation layer, respectively.

In some exemplary embodiments, the at least one differential signal line group and the at least one ground line group are at a same layer on the base substrate.

In some exemplary embodiments, the base substrate is made of glass or organic material; and the functional panel comprises a display panel, a touch panel, or an in-cell touch display panel.

In some exemplary embodiments, in each differential signal line group of the at least one differential signal line group, two signal lines comprise a first signal line and a second signal line, each of the first signal line and the second signal line comprises a first segment and a second segment, the first segment of the first signal line is parallel to the first segment of the second signal line, and the second segment of the first signal line is parallel to the second segment of the second signal line. A ratio of a distance between the first segment of the first signal line and the first segment of the second signal line to a line width at a corresponding position of the first segment of the first signal line or the first segment of the second signal line equals to a ratio of a distance between the second segment of the first signal line and the second segment of the second signal line to a line width at a corresponding position of the second segment of the first signal line or the second segment of the second signal line. The ratio is constant in extending directions of the first segment and the second segment.

According to another exemplary embodiment, there is provided a terminal comprising the functional panel described above.

According to a yet another exemplary embodiment, there is provided a method for manufacturing a functional panel, comprising:

providing a base substrate; and forming at least one differential signal line group and at least one ground line group on a same side of the base substrate. Each ground line group of the at least one ground line group corresponds to each differential signal line group of the at least one differential signal line group one-to-one, each differential signal line group comprises two signal lines, each ground line group comprises two ground lines, orthographic projections of the two ground lines in each ground line group on the base substrate are on both sides of an orthographic projection of a corresponding differential signal line group on the base substrate, respectively, and two ground lines in the ground line group are connected to a same reference ground.

In the functional panel, the method for manufacturing the functional panel, and the terminal provided in the embodiments of the present disclosure, at least one ground line group and at least one differential signal line group are provided on the base substrate, respective one of the at least one ground line group corresponds to respective one of the at least one differential signal line group, each ground line group comprises two ground lines, the orthographic projections of the two ground lines in each ground line group on the base substrate are respectively on both sides of the orthographic projection of a corresponding differential signal line group on the base substrate, and the ground signal is used to shield the signal interference of the differential signal line group. In this way, external signal interference can be effectively reduced, thereby improving the signal transmission reliability of the differential signal line group.

It should be understood that the above general description and the following detailed description are merely exemplary, and should not limit the present disclosure.

BRIEF DESCRIPTION OF THE DRAWINGS

In order to explain the embodiments of the present disclosure more clearly, the drawings used in the description of the exemplary embodiments will be briefly introduced below. Obviously, the drawings in the following description are only some embodiments of the present disclosure. For a person having ordinary skill in the art, other drawings can be obtained based on these drawings without paying creative work.

The drawings herein are incorporated in and constitute a part of this description. The drawings illustrate exemplary embodiments consistent with the present disclosure, and together with the description serve to explain the principles of the present disclosure.

DETAILED DESCRIPTION OF THE DISCLOSURE

In order to make the objectives, technical solutions, and advantages of the present disclosure more clear, exemplary embodiments will be described in further detail below with reference to the accompanying drawings. Obviously, the described exemplary embodiments are only a part of the embodiments of the present disclosure, but not all the embodiments. Based on the embodiments in the present disclosure, all other embodiments obtained by a person having ordinary skill in the art without making creative efforts fall within the protection scope of the present disclosure.

As the demand for signal transmission continues to increase, the application of differential signal line groups is becoming more and more widespread. Current differential signal line groups are mainly used in display devices for transmitting signals between two elements in the display device. At present, a part of the differential signal line group between the timing controller and the source driver chip is located in a bonding area (also called a wiring area) of a base substrate (usually a glass material) of a display panel. The limitation of the manufacturing process of the base substrate causes the signals transmitted on this part of the differential signal line group to be easily interfered with by external signals, thereby reducing the signal transmission reliability.

A common display device comprises a functional panel and a control circuit of the functional panel. A differential signal line group is used to transmit a corresponding control signal or a feedback signal (also called a response signal, that is, a response signal to the control signal).

Figure 1:
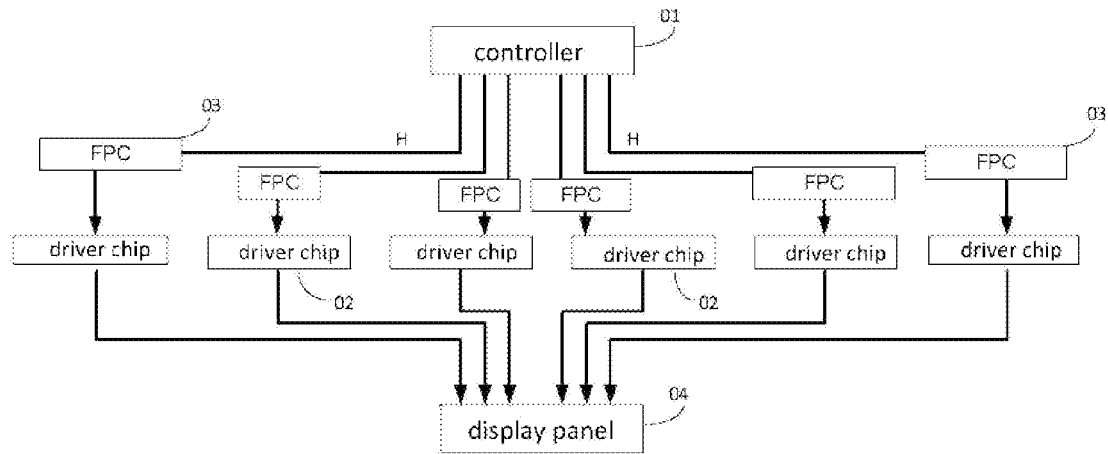
FIG. 1 is a schematic structural diagram of a panel driving circuit according to an exemplary embodiment.

In a first exemplary embodiment, the functional panel is a display panel, and the corresponding control circuit is a panel driving circuit that drives the display panel. The display panel may be an organic light-emitting Diode (OLED) display panel or liquid crystal display (LCD, also referred to as liquid crystal display array) display panel. The panel driving circuit may comprise a controller, a gate driving circuit, and a source driving circuit. The gate driving circuit comprises a plurality of gate driver chips, and the source driving circuit comprises a plurality of source driver chips. As illustrated in FIG. 1, the controller 01 and each driver chip 02 are connected through a flexible printed circuit (FPC) 03. A differential signal line group H is provided between the controller 01 and each driver chip 02. The differential signal line group H usually comprises 3 segments: a first segment between the controller 01 and the FPC 03, a second segment on the FPC 03, and a third segment between the FPC 03 and the driver chip 02. The first segment is located on a printed circuit board (PCB), the third segment is located on the bonding area of the base substrate of the display panel 04, and FPC 03 is connected to the driver chip 02 through a bonding pad. Therefore, the third segment is a segment between a source driver chip and a bonding pad on a bonding area of the base substrate.

It should be noted that the above controller may be any of a timing controller, a system on chip (SOC), and a microcontroller unit (MCU) integrated in the timing controller. The above driver chip may be a source driver chip.

In a second exemplary embodiment, the functional panel is an in-cell touch display panel, and the in-cell touch panel is a display panel integrated with a touch function layer (referred to as a touch layer). That is, the in-cell touch panel is a structure in which the touch function layer is embedded in the pixels of the display panel. The display panel may be an OLED display panel or an LCD display panel.

On the one hand, for the connection relationship between the display panel and the controller in the in-cell touch display panel, reference may be made to the first exemplary embodiment described above. A segment of the differential signal line group between the controller and each driver chip is located on the base substrate of the display panel. For example, a segment of the differential signal line group between the timing controller and each source driver chip is located on the base substrate of the display panel.

Figure 2:
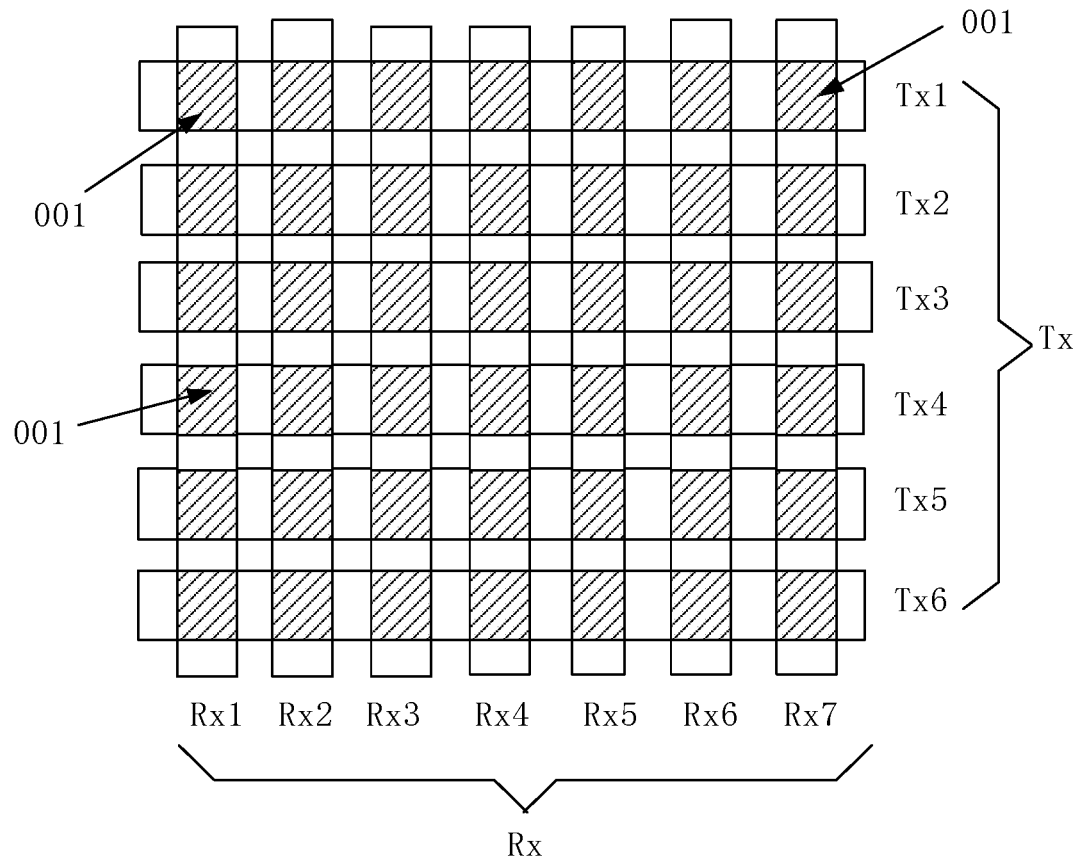
FIG. 2 is a schematic structural diagram of a mutual-capacitive touch function layer according to an exemplary embodiment.

On the other hand, the touch function layer of the in-cell touch display panel is divided into a mutual-capacitive touch function layer and a self-capacitive touch function layer according to different touch principles. As shown in FIG. 2, the mutual-capacitive touch function layer comprises a plurality of touch units 001 arranged in an array. The touch function layer comprises a plurality of touch driving lines Tx arranged horizontally (i.e., the row direction of the panel) and a plurality of touch sensing lines Rx arranged vertically (i.e., the column direction of the panel). A touch driving line Tx corresponds to a row of touch units, and a touch sensing line Rx corresponds to a column of touch units. It should be noted that FIG. 2 takes a total of 7 touch sensing lines Rx and 6 touch driving lines Tx as an example, and the number of touch sensing lines Rx and touch driving lines Tx is not limited in exemplary embodiments.

In the case where the mutual-capacitive touch function layer implements the touch function, touch scanning signals are sequentially input to respective touch driving lines Tx in the mutual-capacitive touch function layer, and the sensing signals on each touch sensing lines Rx are collected. The position of a touch point can be determined according to the sensing signals on each touch sensing lines Rx. The above touch function can be implemented by a touch driving integrated circuit (IC), that is, the touch drive IC can be used to input a touch scanning signal and collect a sensing signal, and determine the position of the touch point. Optionally, differential signal line groups may be respectively provided between the touch drive IC and touch driving line Tx and between the touch drive IC and touch sensing line Rx for transmitting touch data, and a part of the differential signal line group may pass through the base substrate of the display panel.

For the above-mentioned mutual-capacitive touch function layer, in an optional implementation, another differential signal line group may be provided between the controller and the designated driver chip, and each designated driver chip may have a backhaul function, which refers to the function of transmitting the data obtained by the designated driver chip to the controller. The designated driver chip can be connected to at least one touch sensing line Rx (e.g., each designated driver chip with the backhaul function can be connected to a group of touch sensing lines, each group of touch sensing lines comprises at least two adjacent touch sensing lines). The designated driver chip shares some of the functions of the touch drive IC. In another exemplary embodiment, each designated driver chip with the backhaul function can be connected to the touch drive IC. In this case, the designated driver chip realizes the fast backhaul of the data of the touch drive IC to the controller. The designated driver chip may be a source driver chip or a gate driver chip. A part of another differential signal line group described above may pass through the base substrate of the display panel.

Figure 3:
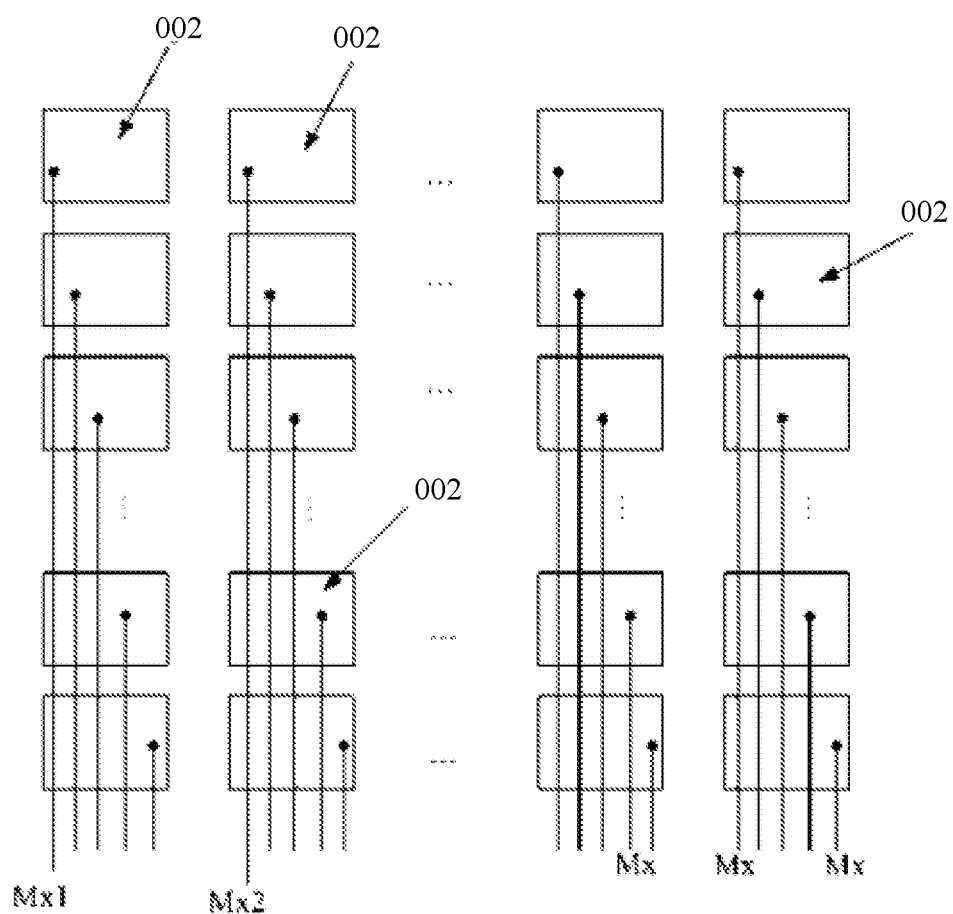
FIG. 3 is a schematic structural diagram of a self-capacitive touch function layer according to an exemplary embodiment.

As shown in FIG. 3, the self-capacitive touch functional layer is generally made of a single layer of indium tin oxide (ITO), which comprises a plurality of touch units 002 arranged in an array. Each touch unit 002 is connected to a touch line Mx, that is, a touch line Mx corresponds to a touch unit.

In the case where the self-capacitive touch function layer implements a touch function, touch scanning signals can be input to each touch line Mx in the self-capacitive touch function layer at the same time, and a sensing signal on each touch line Mx is collected. The position of a touch point can be determined depending on whether the sensing signal on each touch line Mx is the same as the normal sensing signal. The above touch function may be implemented by a touch drive IC, that is, the above touch drive IC may be used to input a touch scanning signal and collect a sensing signal, and determine the position of the touch point. Optionally, a differential signal line group may be provided between the touch drive IC and each touch line Mx for transmission of touch data, and a part of the differential signal line group may pass through the base substrate of the display panel.

For the above-mentioned self-capacitive touch function layer, in an optional implementation, another differential signal line group may be provided between the controller and the designated driver chip, and each designated driver chip may have a backhaul function. Each designated driver chip with the backhaul function can be connected to at least one touch line Mx (e.g., each designated driver chip with the backhaul function can be connected to a group of touch lines, each group of touch lines comprises at least two adjacent touch lines). In this case, the driver chip shares some of the functions of the touch drive IC. In another optional implementation, each designated driver chip with the backhaul function can be connected to the touch drive IC. In this case, the designated driver chip realizes a fast backhaul of data between the controller and the touch drive IC.

It should be noted that the touch function layer in the above-mentioned in-cell touch display panel and the display function layer in the display panel can be a same layer. For example, In the case where the display panel is an OLED display panel, i.e. the display function layer of the display panel is realized based on OLED, when the touch function layer is a mutual-capacitive touch function layer, at least one of the layer where the touch sensing line is located and the layer where the touch driving line is located may be a same layer as an electrode layer of the OLED. The electrode layer may be one of a cathode layer and an anode layer. When the touch function layer is a self-capacitive touch function layer, at least one of the layer where the touch line is located and the layer where the touch driving line is located may be a same layer as an electrode layer of the OLED. The electrode layer may be one of a cathode layer and an anode layer. In the case where the display panel is an LCD display panel, that is, the display function layer of the display panel is realized based on a liquid crystal layer as well as a pixel electrode layer and a common electrode layer for controlling the liquid crystal layer, when the touch function layer is a mutual-capacitive touch function layer, at least one of the layer where the touch sensing line is located and the layer where the touch driving line is located may be a same layer as an electrode layer in the display function layer. The electrode layer may be one of the pixel electrode layer and the common electrode layer. When the control function layer is a self-capacitive touch function layer, at least one of the layer where the touch line is located and the layer where the touch driving line is located may be a same layer as an electrode layer of the LCD. The electrode layer may be one of the pixel electrode layer and the common electrode layer.

It is noted that, when the touch function layer in the above-mentioned in-cell touch display panel is the same layer as the display function layer in the display panel, the touch function layer and the display function layer are driven in a time-sharing manner, which can ensure that these two functional layers do not interfere with each other.

In a third exemplary embodiment, the functional panel is a touch panel. The touch panel is divided into a mutual-capacitive touch panel and a self-capacitive touch panel according to different touch principles. The structure of a mutual-capacitive touch panel can refer to the structure of the mutual-capacitive touch function layer in the second optional implementation described above. Differential signal line groups can be respectively provided between the touch drive IC and touch driving lines TX and between the touch drive IC and touch sensing lines Rx for transmitting touch data, and a part of the differential signal line group may pass through the base substrate of the touch panel. The structure of the self-capacitive touch panel can refer to the structure of the self-capacitive touch function layer in the second optional implementation described above. A differential signal line group may be provided between the touch drive IC and each touch line Mx for transmitting touch data, and a part of the differential signal line group may pass through the base substrate of the touch panel.

The above three optional implementations are only a schematic description of a scenario in which the differential signal line group is located on the base substrate of the functional panel. The differential signal line group can also be provided on the base substrate of the functional panel in other ways. However, due to the limitation of the manufacturing process on the base substrate, the signal transmission in the differential signal line group on the base substrate may be easily interfered by external signals, thereby reducing the signal transmission reliability.

Figure 4:
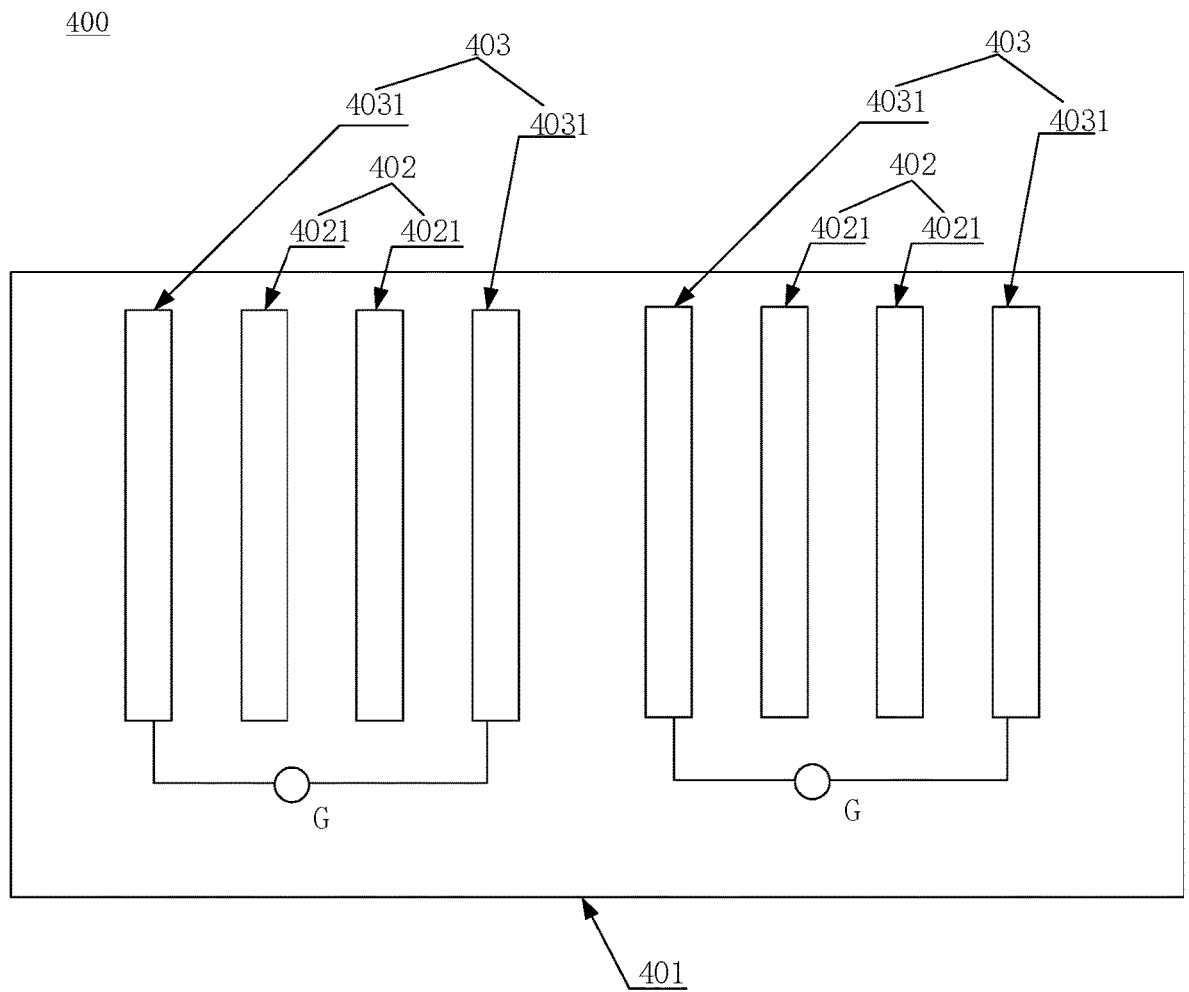
FIG. 4 is a schematic structural diagram of a functional panel according to an exemplary embodiment.

An exemplary embodiment provides a functional panel 400. The functional panel may be any of the above functional panels or another functional panel provided with a differential signal line group on its base substrate. FIG. 4 is a schematic top view of the functional panel 400. As shown in FIG. 4, the functional panel 400 comprises a base substrate 401, at least one differential signal line group 402 and at least one ground line group 403. Optionally, the base substrate 401 is a transparent base substrate, and is made of glass or organic. The at least one differential signal line group 402 is on the base substrate 401, and each differential signal line group 402 comprises two signal lines 4021. The at least one ground line group 403 is on the base substrate 401 and on the same side of the base substrate as the at least one differential signal line group 402, and respective one of the at least one ground line group 403 corresponds to respective one of the at least one differential signal line group 402. Each ground line group 403 comprises two ground lines 4031. Orthographic projections of the two ground lines 4031 in each ground line group 403 on the base substrate are respectively on both sides of the orthographic projection of a corresponding differential signal line group 402 on the base substrate, and two ground lines 4031 in the ground line group 403 are connected to a same reference ground G. The connection to the same reference ground is also called a common ground. FIG. 4 takes two differential signal line groups and two ground line groups as an example for description, but the number of the differential signal line groups and the ground line groups is not limited.

"Reference ground" is also called "ground", which is a common reference potential point in the functional panel. In the functional panel of the embodiment of the present disclosure, a metal layer is usually provided on the base substrate, and the metal layer is used as a reference ground. Two ground lines in each ground line group are connected to the metal layer. Of course, the reference ground can also be provided in other ways, as long as the two ground lines in a ground line group are connected to the same reference ground. The potential of the reference ground usually approaches zero. In practical applications, the potential of the reference ground can be regarded as zero.

In the functional panel provided in the exemplary embodiments, at least one ground line group and at least one differential signal line group are provided on the base substrate, respective one of the at least one ground line group corresponds to respective one of the at least one differential signal line group. Each ground line group comprises two ground lines, the orthographic projections of the two ground lines in each ground line group on the base substrate are respectively located on both sides of the orthographic projection of the corresponding differential signal line group on the base substrate, and the ground signal is used to shield the signal interference on the differential signal line group. When there are a plurality of differential signal line groups, crosstalk between the differential signal line groups can also be effectively shielded. In this way, external signal interference can be effectively reduced, thereby improving the signal transmission reliability of the differential signal line groups.

If two ground lines in a ground line group are respectively connected to different reference grounds, each ground line can be regarded as an isolated ground line which is prone to generate additional noise and interference. In the embodiment of the present disclosure, the two ground lines in the ground line group are connected to the same reference ground, which can avoid the appearance of isolated ground lines and improve the anti-interference ability of the ground lines in the ground line group.

Figure 5:
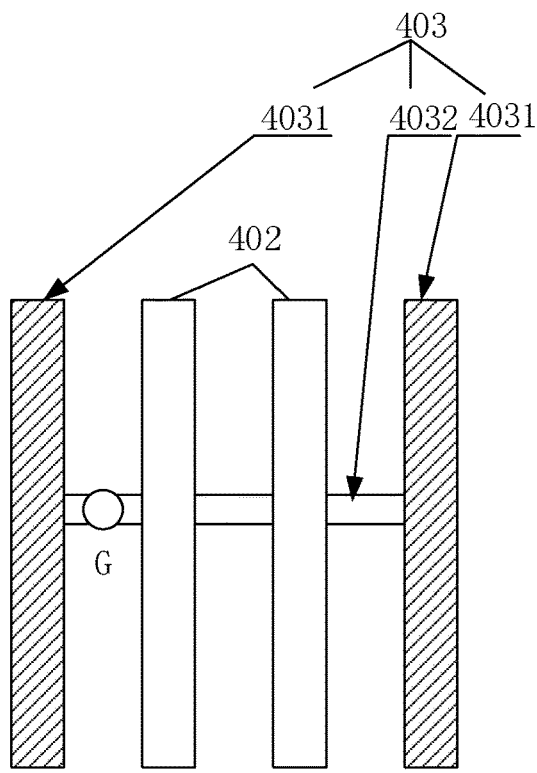
FIG. 5 is a schematic diagram illustrating a position relationship between a ground line group and a corresponding differential signal line group in a functional panel according to an exemplary embodiment.

FIG. 5 shows a schematic diagram illustrating a position relationship between a ground line group and a corresponding differential signal line group in a functional panel according to an embodiment of the present disclosure. If middle parts of the two ground lines 4031 in a ground line group 403 are connected to the reference ground G, the orthographic projections of the two ground lines 4031 in the ground line group 403 and the orthographic projection of the lead 4032 for connecting the two ground lines 4031 to the reference ground G on the base substrate cannot enclose the orthographic projection of the corresponding differential signal line group 402 on the base substrate, so that the ground line group has a poor ability to shield the signal interference on the differential signal line group.

Figure 6:
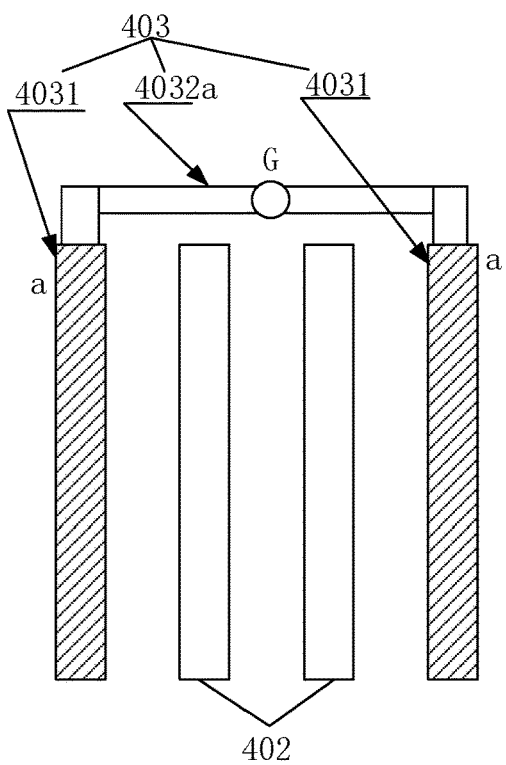
FIG. 6 is a schematic diagram illustrating a position relationship between a ground line group and a corresponding differential signal line group in another functional panel according to an exemplary embodiment.
Figure 7:
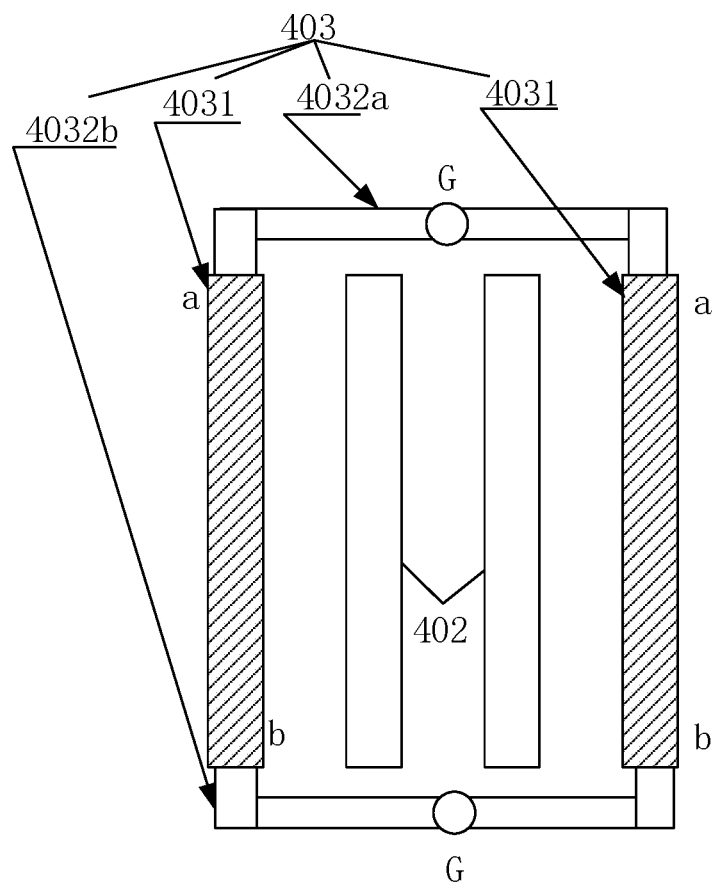
FIG. 7 is a schematic diagram illustrating a position relationship between a ground line group and a corresponding differential signal line group in still another functional panel according to an exemplary embodiment.

FIG. 6 and FIG. 7 are schematic diagrams illustrating a position relationship between a ground line group and a corresponding differential signal line group in two functional panels according to embodiments of the present disclosure. The two ground lines in the ground line group 403 comprise a first ground line and a second ground line. At least one end of the first ground line is connected to the same reference ground G as at least one end of the second ground line. FIG. 6 shows a case where one end of each of two ground lines in the ground line group 403 is connected to the same reference ground G. For example, the first ends a of the two ground lines in the ground line group in FIG. 6 are connected through a first lead 4032a, and the first lead 4032a is connected to the reference ground G. FIG. 7 shows an exemplary embodiment where both ends of two ground lines in the ground line group 403 are connected to the same reference ground G, respectively. In FIG. 7, the first ends a of the two ground lines in the ground line group 403 are connected to the same reference ground G. For example, the first ends a of the two ground lines in the ground line group are connected through the first lead 4032a, and the first lead 4032a is connected to the reference ground G. The second ends b of the two ground lines in the ground line group are connected to the same reference ground G. For example, the second ends b of the two ground lines in the ground line group are connected through a second lead 4032b, and the second lead 4032b is connected to the reference ground G. The first end and the second end of any ground line are two opposite ends in the extending direction of any ground line.

Please refer to FIG. 6 and FIG. 7, because at least one end of each of two ground lines in the ground line group 403 is connected to the same reference ground G, the first lead 4032a and/or the second lead 4032b described above is equivalent to an extended ground line. In this way, the orthographic projections of the two ground lines 4031 in the ground line group 403 and the orthographic projection of the first lead 4032a and/or the second lead 4032b for connecting the two ground lines 4031 to the reference ground G on the base substrate may partially enclose or fully enclose the orthographic projection of the corresponding differential signal line group 402 on the base substrate, so that the ground line group has a better ability to shield the signal interference on the differential signal line group.

Figure 8:
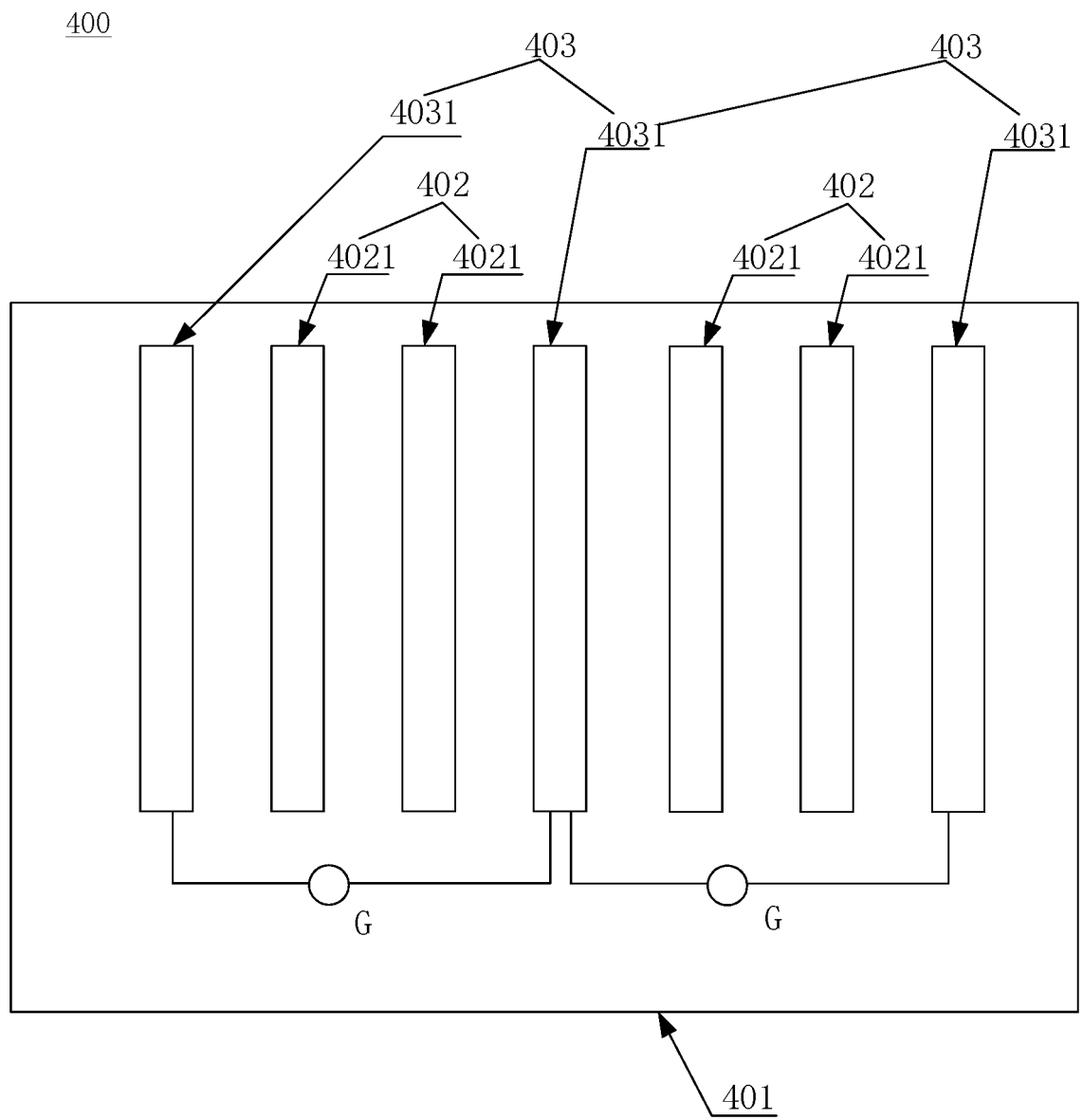
FIG. 8 is a schematic structural diagram of another functional panel according to an exemplary embodiment.

Referring back to FIG. 4, in the display panel, the at least one differential signal line group 402 comprises a plurality of differential signal line groups arranged in an array, and the at least one ground line group 403 comprises a plurality of ground line groups arranged in an array. FIG. 4 shows a case where each ground line group in every two adjacent ground line groups comprises two ground lines. In another exemplary embodiment illustrated in FIG. 8, every two adjacent ground line groups 403 multiplex a same ground line. In this way, it can effectively shield the interference signals on the basis of reducing the number of ground lines and reducing the manufacturing difficulty. In particular, the crosstalk between the differential signal line groups can be shielded. Every two adjacent ground line groups in the plurality of ground line groups multiplexing the same ground line means that, referring to FIG. 8, each ground line group 403 may comprise a first ground line and a second ground line, and in every two adjacent ground line groups, the second ground line in the previous ground line group can simultaneously serve as the first ground line in the subsequent ground line group. In this way, each ground line group 403 comprises two ground lines, and the orthographic projections of the two ground lines on the base substrate are located on both sides of the orthographic projection of the corresponding differential signal line group on the base substrate. The beneficial effects of the present disclosure can be achieved while reducing the number of ground lines.

Figure 9:
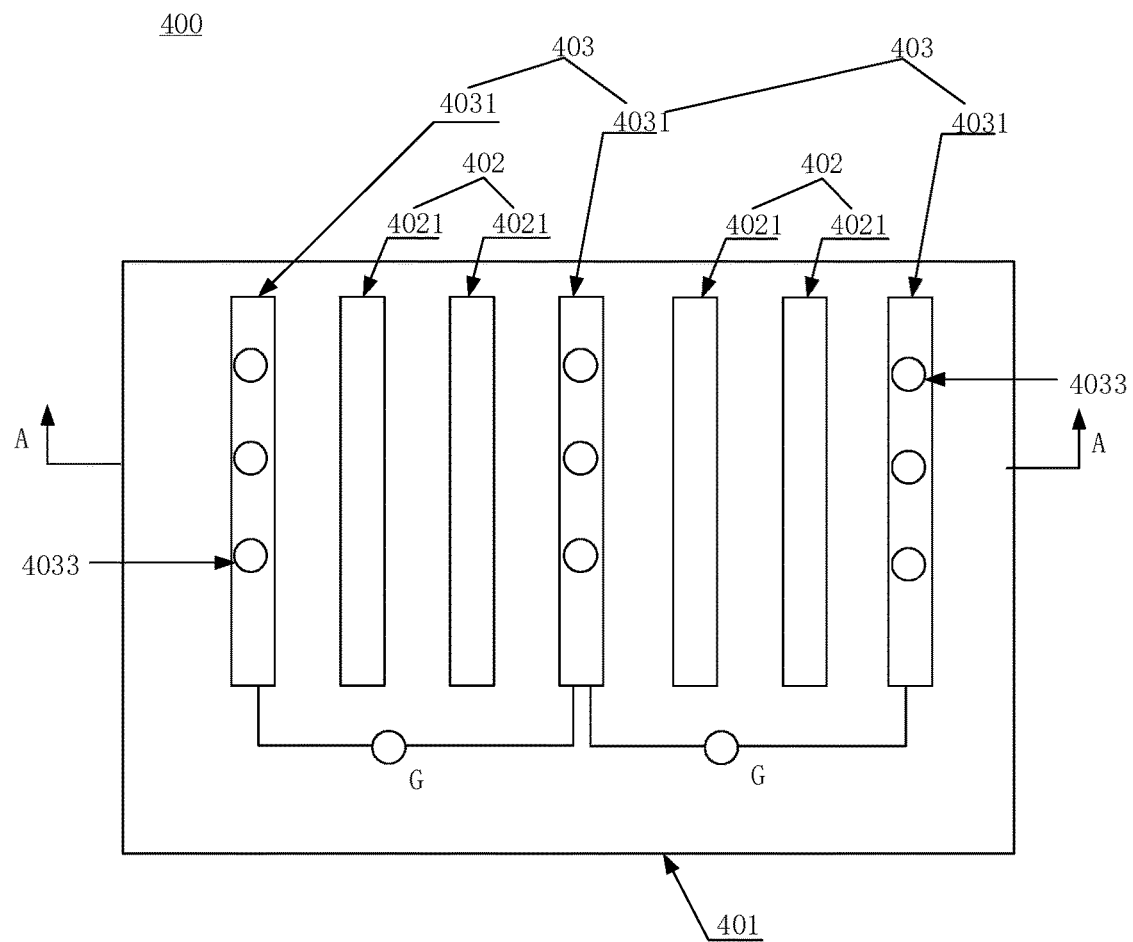
FIG. 9 is a schematic structural diagram of still another functional panel according to an exemplary embodiment.

Further, as shown in FIG. 9, each ground line 4031 is provided with at least one via 4033. By way of example, a plurality of vias 4033 arranged at equal intervals are provided in each ground line 4031. By providing vias in the ground line, the impedance of the ground line can be reduced, so that the signal attenuation on the ground line is small, and further, the ground line group can effectively shield the interference signals when it encloses the corresponding differential signal line group. Optionally, the length of the ground line in each ground line group is longer than or equal to the length of the signal line in the corresponding differential signal line group. In this way, it is possible to effectively enclose the corresponding differential signal line group by the ground line group.

In an exemplary embodiment, at least one differential signal line group 402 and at least one ground line group 403 are located at the same layer on the base substrate 401. In this way, the ground line group and the differential signal line group are located on the same horizontal plane, thereby the interference signals can be effectively shielded when the ground line group can actually enclose the corresponding differential signal line group at the physical position. For example, if the differential signal line group provided on the base substrate is an entire segment of the differential signal line group, each ground line in the corresponding ground line group is an entire segment of ground line. If the differential signal line groups provided on the base substrate comprises multiple segments of differential signal line groups located at different layers, each ground line in the corresponding ground line group also comprises multiple segments of ground lines located at different layers, and respective one of the multiple segments of differential signal line groups corresponds to respective one of the multiple segments of ground lines. The differential signal line group and ground line of the corresponding segment are located at the same layer.

Figure 10:
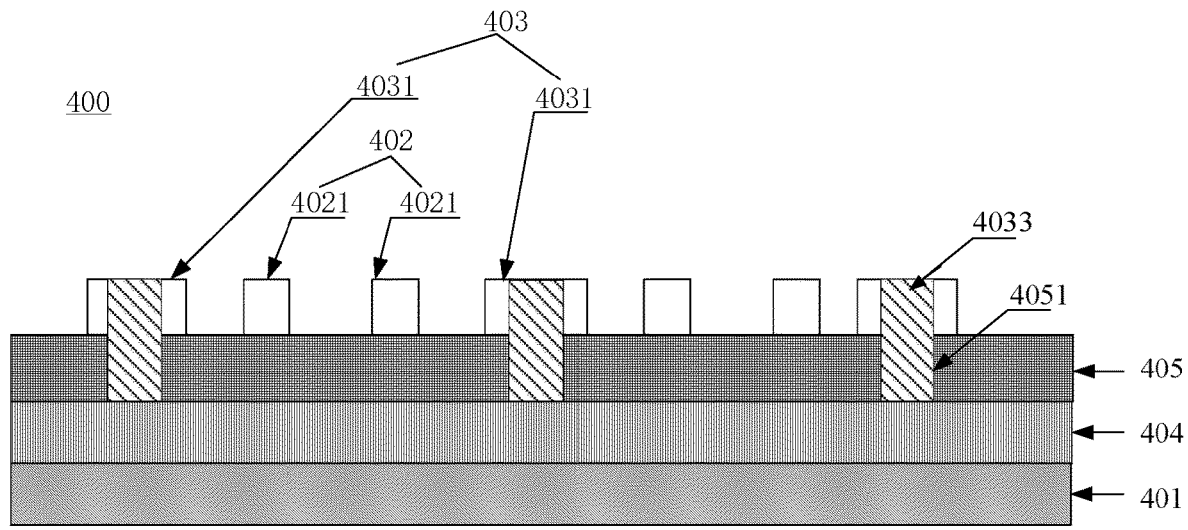
FIG. 10 is a schematic cross-sectional view taken along A-A of FIG. 9.

As mentioned above, there are multiple implementations of the reference ground in the function panel. Optionally, an exemplary embodiment implements the reference ground function by providing a reference ground layer on the base substrate. The manufacturing material of the reference ground layer may be conductive materials such as metal or carbon. Please refer to FIGS. 10-11, which are schematic cross-sectional views taken along the line A-A in FIG. 9. The functional panel 400 further comprises a reference ground layer 404 and an insulation layer 405 which are sequentially stacked in a direction away from the base substrate 401. At least one ground line group 403 is on a side of the insulation layer 405 away from the reference ground layer 404. A plurality of vias 4051 are provided in the insulation layer 405. At least one ground line group 403 is connected to the reference ground layer 404 through a plurality of vias 4051. In an exemplary embodiment, each ground line group 403 may be connected to the reference ground layer 404 through at least one via 4051. Since each ground line group and the corresponding differential signal line group are usually arranged to be parallel to the base substrate, each ground line group can shield the interference signals for the corresponding differential signal line group in the direction parallel to the base substrate. Each via 4051 is equivalent to a vertical ground line, which can shield the interference signals for the corresponding differential signal line group (that is, the differential signal line group corresponding to the ground line connected to the via 4051) in a direction perpendicular to the base substrate. When the ground line group and the reference ground layer are connected through a plurality of vias, the ground line group, the reference ground layer, and the plurality of vias can form a three-dimensional shielding mesher covering the corresponding differential signal line group, thereby realizing the three-dimensional shielding of the interference signals for the differential signal line group and thus achieving better interference shielding effects.

Further, a shown in FIG. 6 and FIG. 7, at least one ends of two ground lines in the ground line group are connected by a lead, and the lead is connected with the reference ground layer through a via. That is, the first ends a of the two ground lines in the ground line group are connected through the first lead 4032a, and the first lead 4032a is connected to the reference ground layer through a via. Alternatively, or additionally, the second ends b of the two ground lines in the ground line group are connected through the second lead 4032b, and the second lead 4032b is connected to the reference ground layer through a via. The leads connecting the ground lines and the reference ground layer (i.e., the first lead 4032a and/or the second lead 4032b) and the vias between the reference ground layer and the ground lines are equivalent to vertical ground lines, which can shield the interference signals for the corresponding differential signal line group in a direction perpendicular to the base substrate. If the leads and the reference ground layer are connected through a plurality of vias and the ground line group and the reference ground layer are connected through a plurality of vias, the leads, the ground line group, the reference ground layer and the plurality of vias can form a denser three-dimensional shielding mesher covering the corresponding differential signal line group, thereby realizing the three-dimensional shielding of the interference signals for the differential signal line group and thus achieving better interference shielding effects.

Figure 11:
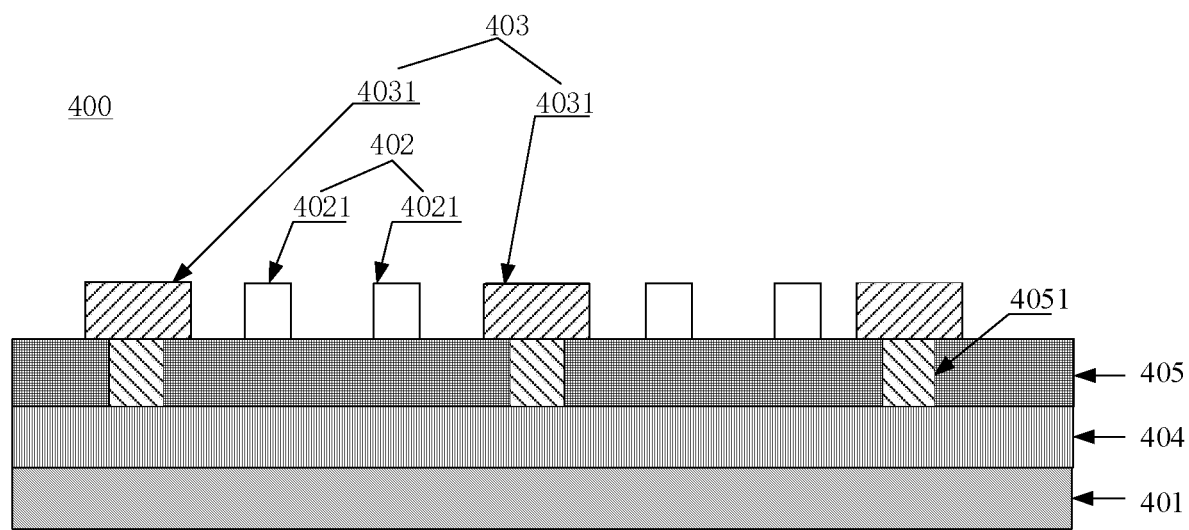
FIG. 11 is a schematic cross-sectional view taken along A-A of FIG. 9 according to another exemplary embodiment.

Each of the aforementioned ground lines 4031 is provided with a via 4033. The vias 4033 in the ground line 4031 in FIG. 10 may be formed in multiple ways. In an exemplary embodiment, after forming a plurality of vias 4051 in the insulation layer 405, the plurality of vias 4051 in the insulation layer 405 may be filled with a conductive material, and the conductive material may be the same as or different from the manufacturing material of the ground line. Then, a conductive material layer is formed on the insulation layer 405, and one patterning process is performed to the conductive material layer to form the ground line group 403 with vias 4033. That is, the ground line group 403 and the vias 4033 are manufactured by one patterning process, which may comprise photoresist coating, exposure, development, etching, and photoresist stripping. In another exemplary embodiment, after a plurality of vias 4051 are formed in the insulation layer 405, a conductive ground layer can be formed on the insulation layer 405. Since the ground layer is directly covered on the insulation layer 405, a plurality of vias 4033 are formed in the ground layer covering the above plurality of vias 4051, and respective one of the plurality of vias 4033 corresponds to respective one of the plurality of vias 4051. After that, a patterning process is performed to the ground layer to form the ground line group 403. The patterning process may comprise photoresist coating, exposure, development, etching and photoresist stripping. In some exemplary embodiments, as shown in FIG. 11, vias 4051 may be formed in the insulation layer 405, and the vias 4051 are filled with a conductive material to realize the connection between the ground line group 403 and the reference ground layer 404.

It should be noted that if at least one ends of two ground lines in the ground line group are connected by a lead, the ground line group and the lead can be formed through one patterning process. If the lead is connected to the ground line layer through a via, the manufacturing process of the vias in the lead can refer to the manufacturing process of the vias of the above ground line, and the vias of both can be manufactured simultaneously.

As before, the structure of the above-mentioned functional panel provided by an exemplary embodiment can be applied to various types of functional panels, as long as the differential signal line group is located on the base substrate. The differential signal line group is usually located in a bonding area of the functional panel. Of course, it can also be located in other areas of the functional panel. To facilitate the reader's understanding, the exemplary embodiment takes an optional functional panel in which the differential signal line group is located in the bonding area of the functional panel as an example. The functional panel may be a display panel. Please refer to FIG. 12, FIG. 13, and FIG. 14. The functional panel 400 further comprises at least one bonding pad 406 and at least one driver chip 407 which may be a source driver chip. Respective one of the at least one bonding pad 406 is connected to respective one of the at least one driver chip 407 through a differential signal line group 402. A corresponding ground line group 403 is provided between the bonding pad 406 and the driver chip 407 connecting through a differential signal line group 402. Please refer to FIGS. 6 and 7, at least one ends of two ground lines in the ground line group 403 are connected to the same reference ground G. In the functional panel 400 shown in FIGS. 12 to 14, there may be multiple implementations of connecting at least one ends of two ground lines in the ground line group to the same reference ground G. In an optional implementation, please refer to FIG. 6 and FIG. 7, at least one ends of two ground lines in the ground line group are connected by a lead, and the lead is connected to the reference ground layer through a via. In another optional implementation, at least one ends of two ground lines in the ground line group are connected to the same reference ground through a driver chip. FIGS. 13 and 14 show the implementations of the connections between the ground lines in the two ground line groups and the driver chips, respectively.

In a first exemplary embodiment, as shown in FIG. 13, each driver chip 407 comprises a ground pad c and two signal pads d, and the ground pad c is grounded. That is, the ground pad c is connected to a reference ground of the functional panel, for example, the above reference ground layer. The ground pad c is located on one side of the two signal pads d, and the two signal pads d are respectively connected to the two signal lines 4021 in the corresponding differential signal line group. In the ground line group corresponding to the differential signal line group, one ground line 4031*a* on the same side of the differential signal line group as the ground pad is directly connected to the ground pad, and another ground line 4031*b* on the different side of the differential signal line group as the ground pad is connected to the ground pad c through a third lead x that is insulated from both two signal lines. The orthographic projection of the third lead x on the base substrate 401 crosses the orthographic projections of the two signal lines 4021 on the base substrate 401.

The third lead x is located on a side of the two signal lines 4021 away from the base substrate 401, and laps over the two signal lines 4021. An insulating spacer is provided at a lap-joint between the third lead x and the two signal lines 4021. This can ensure that the third lead x does not affect the signal transmission on the two signal lines 4021. Alternatively, the third lead x and the ground line group 403 are located at different layers, and an isolation layer for insulating is provided between the third lead x and the ground line group 403. One end of the third lead x is connected to a target end of a ground line through a via in the isolation layer, and the other end of the third lead x is connected to a target end of another ground line through a via in the isolation layer. The target end is the end of the ground line closer to the ground pad. FIG. 13 illustrates a case where the third lead x laps over the two signal lines 4021.

In a second exemplary embodiment, as shown in FIG. 14, each driver chip 407 comprises two ground pads c (a first ground pad and a second ground pad), and the two ground pads c are connected to the same reference ground of the functional panel, for example, the above reference ground layer. Two ground pads c are respectively located on both sides of two signal pads d. The two signal pads d are used to respectively connect to the two signal lines 4021 in the corresponding differential signal line group. In the ground line group corresponding to the differential signal line group, the ground lines (the first ground line and the second ground line) located on both sides of the differential signal line group are respectively connected to the two ground pads c.

Of course, in addition to the above two exemplary embodiments, the ground line of the ground line group can also be connected to the driver chip in other ways. For example, in the first exemplary embodiment described above, the source driver chip has a ground pad. The lead is connected to the ground pad at the other side of the driver chip, and the orthographic projection of the lead on the base substrate does not cross the orthographic projections of the two signal lines on the base substrate.

It should be noted that FIG. 13 and FIG. 14 take only one differential signal line group and one ground line group as an example to explain the position relationship. In an actual implementation, for the position relationships of each differential signal line group and the corresponding ground line group, reference may be made to FIG. 13 or FIG. 14. Of course, the foregoing functional panel may also have other implementations. For example, a plurality of driver chips may share one ground pad, which is not described in the embodiment of the present disclosure again.

Figure 12:
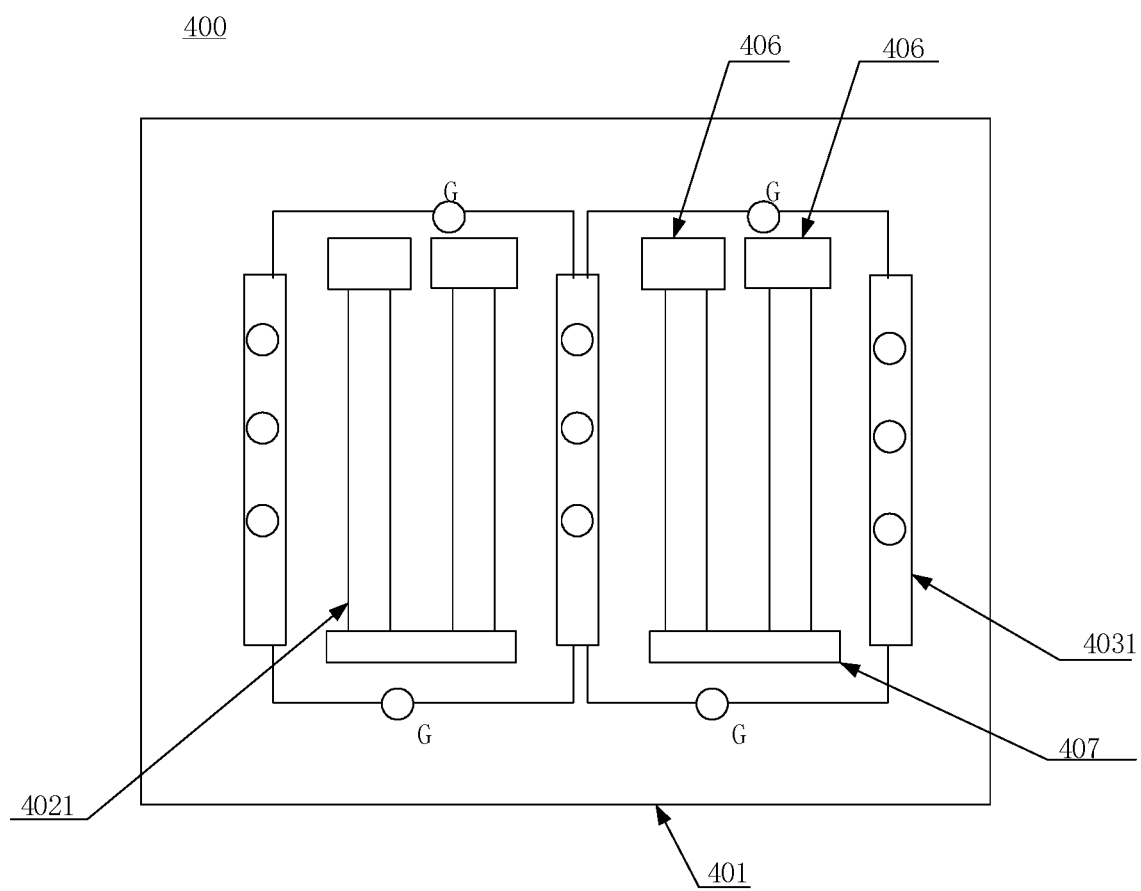
FIG. 12 is a schematic structural diagram of a functional panel according to another exemplary embodiment.
Figure 13:
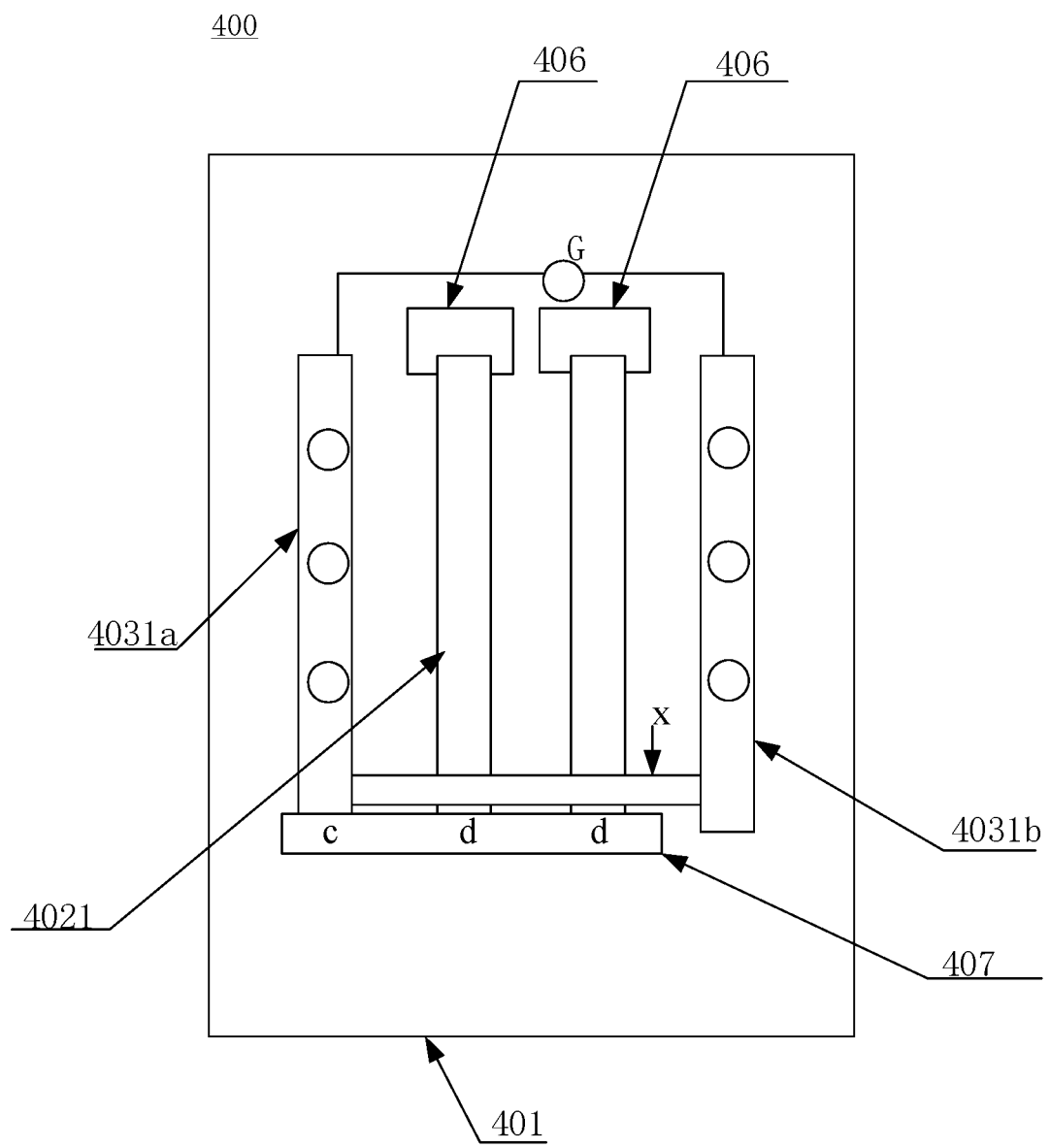
FIG. 13 is a schematic structural diagram of another functional panel according to another exemplary embodiment.
Figure 14:
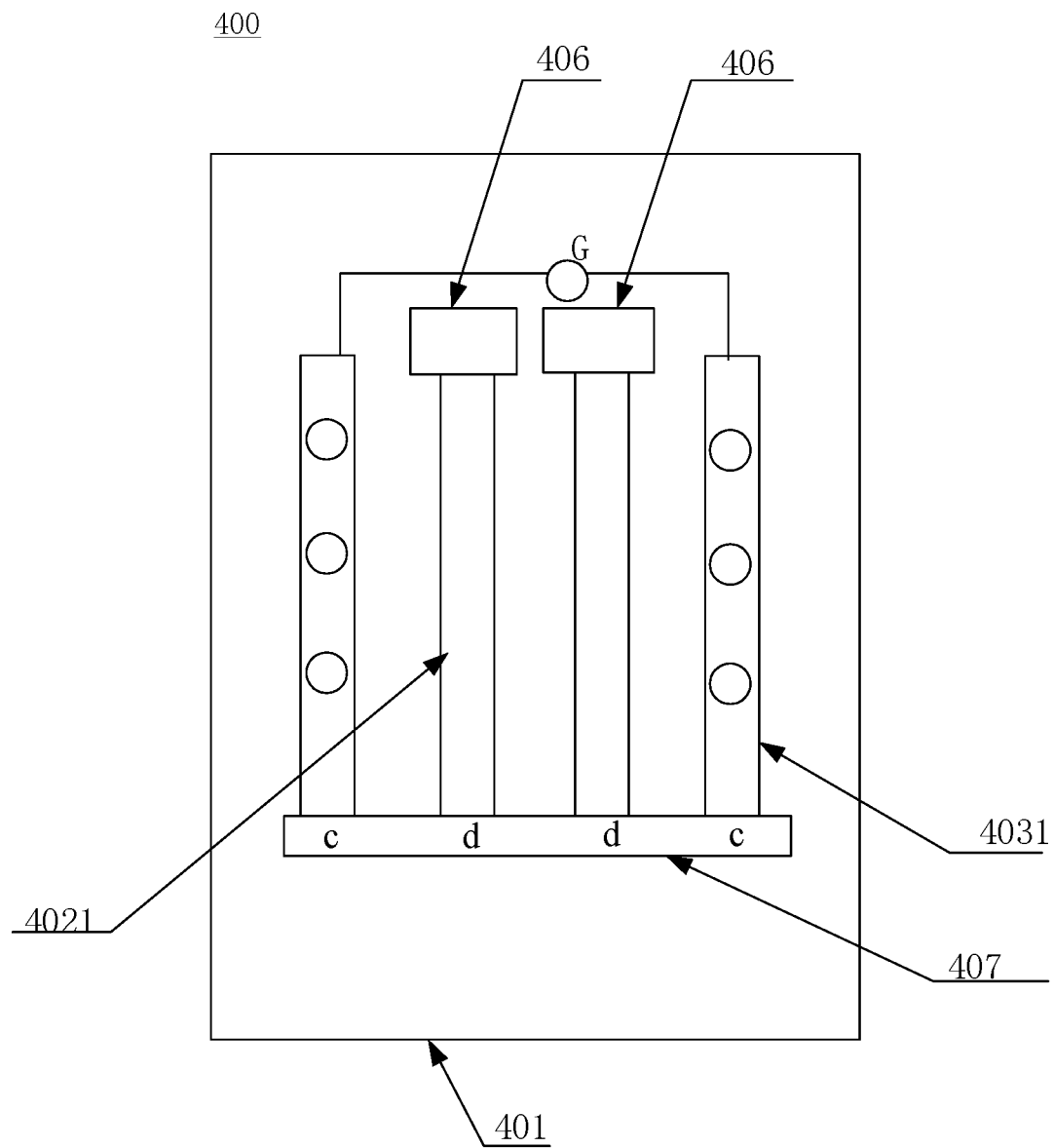
FIG. 14 is a schematic structural diagram of still another functional panel according to another exemplary embodiment.

In the above FIG. 12 to FIG. 14, an end of the ground line in the ground line group away from the driver chip may not be connected to the reference ground, or may be connected to the reference ground. If it is connected to the reference ground, in an optional implementation, bonding pads are provided on the display panel, respective one of the bonding pads corresponding to respective one of the ground line groups, and the bonding pads are connected to the reference ground. For example, the bonding pads are connected to the reference ground layer through vias, and the vias can be located in the bonding pads (that is, the bonding pads are provide with vias). Each ground line group is connected to the corresponding bonding pad. The ground line can be connected to the bonding pad directly or through a lead. The lead can cross and be insulated from the differential signal line group. Alternatively, the lead may not cross the differential signal line group and bypass the differential signal line group. In another optional implementation, bonding pads are provided on the display panel, respective one of the bonding pads corresponding to respective one of the ground lines, and the bonding pads corresponding to the ground lines in the same ground line group are connected to the same reference ground. The bonding pad and the corresponding ground line are located on the same side of the differential signal line group, and they are directly connected. In yet another optional implementation, one grounded bonding pad can be provided on the display panel (for example, the bonding pad is connected to the reference ground layer through a via). All ground lines in the ground line group are connected to the bonding pad, and each ground line and the bonding pad can be directly connected or connected through a lead. The lead can cross and be insulated from the differential signal line group. Alternatively, the lead may not cross the differential signal line group and bypass the differential signal line group. The exemplary embodiment does not limit this.

Figure 15:
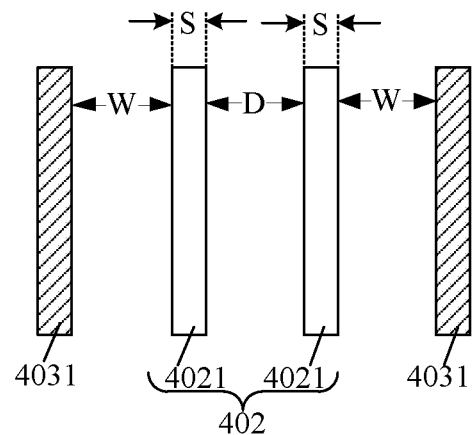
FIG. 15 is a layout model diagram of a differential signal line group provided by some exemplary embodiments.

In some exemplary embodiments, as shown in FIG. 15, the distance between the ground line 4031 and the differential signal line group 402 on the two sides is W, the width of the differential signal line 4021 in the differential signal line group 402 is S, and the distance between the two differential signal lines 4021 is D.

Figure 16:
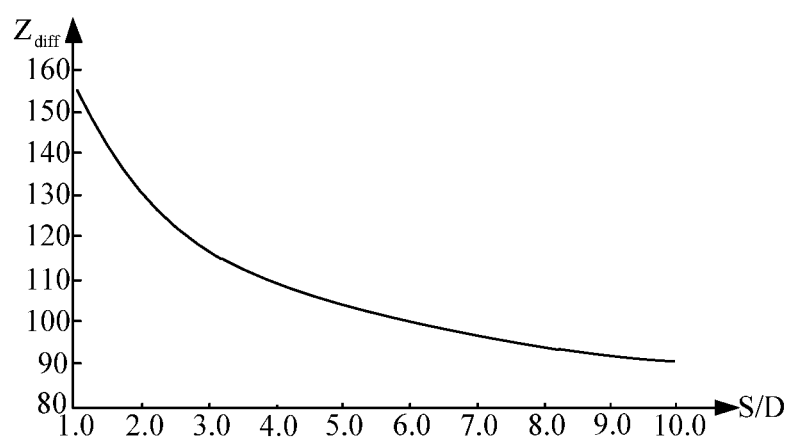
FIG. 16 is a relationship curve between a characteristic impedance and S/D provided by some exemplary embodiments.

Based on this, by adjusting the values of W, D, and S, as shown in FIG. 16, by simulating different products, it is found that the main factor affecting the characteristic impedance is the value of S/D.

Figure 17:
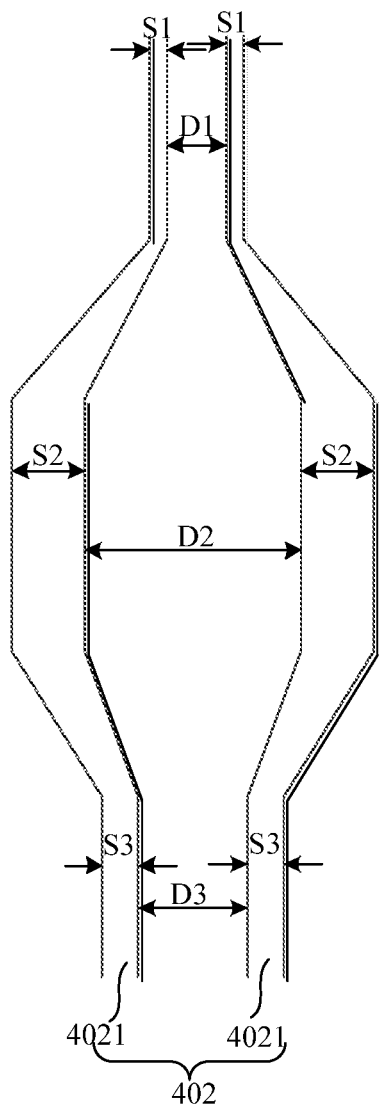
FIG. 17 is a schematic structural diagram of a differential signal line group provided by some exemplary embodiments.

Therefore, when the differential signal line group 402 according to an exemplary embodiment is designed, the value of S/D can be determined to be a constant according to different frame requirements. That is, in each differential signal line groups 402, two signal lines 4021 comprise a first signal line and a second signal line, each of the first signal line and the second signal line comprises a first segment and a second segment, the first segment of the first signal line is parallel to the first segment of the second signal line, and the second segment of the first signal line is parallel to the second segment of the second signal line. A ratio of a distance between the first segment of the first signal line and the first segment of the second signal line to a line width at a corresponding position of the first segment of the first signal line or the first segment of the second signal line equals to a ratio of a distance between the second segment of the first signal line and the second segment of the second signal line to a line width at a corresponding position of the second segment of the first signal line or the second segment of the second signal line. The ratio is constant in extending directions of the first segment and the second segment. That is, referring to FIG. 17, the characteristic impedance of the differential signal line group 402 can be ensured by making D1/S1=D2/S2=D3/S3.

For ease of explanation, the above-mentioned FIGS. 4 to 17 are partial structural schematic diagrams of functional panels. In fact, functional panels also comprise other areas and other structures. For example, when the functional panel is a display panel, it also comprises a display area. Exemplary embodiments do not limit this. Further, the two signal lines in the above differential signal line group may be arranged in parallel (that is, their projections on the base substrate are parallel), and the two ground lines in the corresponding ground line group may also be arranged in parallel (that is, their projections on the base substrate are parallel). However, in actual implementation, due to the need to consider other structures, the signal lines in the differential signal line group and the ground lines in the ground line group may not be parallel, which is not limited in the exemplary embodiments.

In summary, in the functional panel provided in the exemplary embodiments, at least one ground line group and at least one differential signal line group are provided on the base substrate, respective one of the at least one ground line group corresponds to respective one of the at least one differential signal line group. Each ground line group comprises two ground lines, the orthographic projections of the two ground lines in each ground line group on the base substrate are respectively located on both sides of the orthographic projection of the corresponding differential signal line group on the base substrate, and the ground signal is used to shield the signal interference for the differential signal line group. In this way, external signal interference can be effectively reduced and the integrity of the signals transmitted on the differential signal line group can be ensured, thereby improving the signal transmission reliability of the differential signal line group.

An exemplary embodiment provides a terminal comprising the functional panel of any of the foregoing embodiments of the present disclosure. The terminal can be a mobile phone, television, electronic paper, computer, digital broadcasting terminal, messaging device, game console, tablet device, medical device, fitness equipment, personal digital assistant, display, notebook computer, digital photo frame or navigator.

Figure 18:
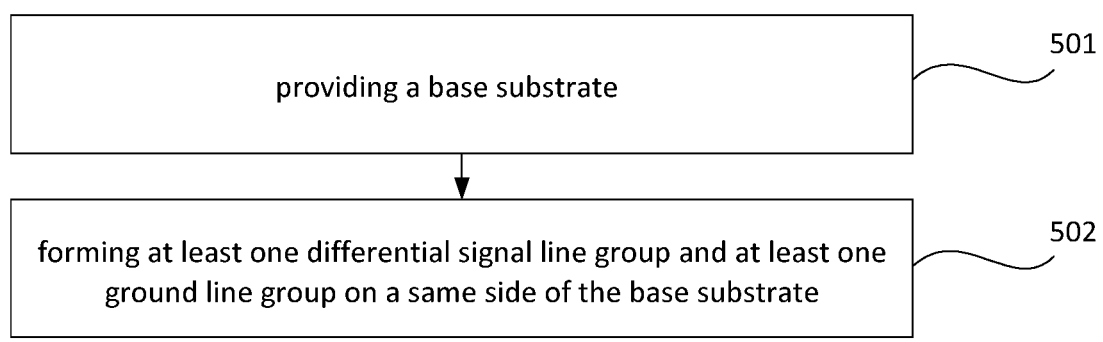
FIG. 18 is a flow chart showing a method for manufacturing a functional panel according to an exemplary embodiment.

An exemplary embodiment provides a method for manufacturing a functional panel, as shown in FIG. 18, the method comprises:

step 501: providing a base substrate; and step 502: forming at least one differential signal line group and at least one ground line group on a same side of the base substrate.

Respective one of the at least one ground line group corresponds to respective one of the at least one differential signal line group. Each differential signal line group comprises two signal lines, each ground line group comprises two ground lines, orthographic projections of the two ground lines in each ground line group on the base substrate are respectively on both sides of an orthographic projection of a corresponding differential signal line group on the base substrate, and two ground lines in the ground line group are connected to a same reference ground.

In methods for manufacturing a functional panel and the terminal provided in the exemplary embodiments, at least one ground line group and at least one differential signal line group are provided on the base substrate, respective one of the at least one ground line group corresponds to respective one of the at least one differential signal line group. Each ground line group comprises two ground lines, the orthographic projections of the two ground lines in each ground line group on the base substrate are respectively located on both sides of the orthographic projection of the corresponding differential signal line group on the base substrate, and the ground signal is used to shield the signal interference for the differential signal line group. In this way, external signal interference can be effectively reduced, thereby improving the signal transmission reliability of the differential signal line group.

There may be multiple implementations about the above step 502. As described above, at least one differential signal line group and at least one ground line group are located at the same layer on the base substrate.

If the differential signal line group and the ground line group located on the base substrate are not segmented, that is, the differential signal line group provided on the base substrate is an entire segment of the differential signal line group, each ground line in the corresponding ground line group is an entire segment of ground line. In a case where the manufacturing materials of the two are the same, a conductive material layer can be formed on the base substrate, and one patterning process is performed to the conductive material layer to form the at least one differential signal line group and at least one ground line group. In another case where the manufacturing materials of the two are different, a first conductive material layer can be formed on the base substrate, one patterning process is performed to the first conductive material layer to form the at least one differential signal line group. Then a second conductive material layer is formed on the base substrate, and one patterning process is performed to the second conductive material layer to form the at least one ground line group. Alternatively, a second conductive material layer can be formed on the base substrate, one patterning process is performed to the second conductive material layer to form the at least one ground line group, and then a first conductive material layer is formed on the base substrate, and one patterning process is performed to the first conductive material layer to form the at least one differential signal line group.

In some exemplary embodiments, the differential signal line group and the ground line group located on the base substrate are both segmented. For example, the differential signal line group provided on the base substrate comprises multiple segments of differential signal line groups located at different layers, each ground line in the corresponding ground line group also comprises multiple segments of ground lines located at different layers, and respective one of the multiple segments of differential signal line groups corresponds to respective one of the multiple segments of ground lines. The differential signal line group and ground line of the corresponding segment are located at the same layer. For a method of manufacturing the differential signal line group and the corresponding ground line group in each layer, please refer to the foregoing method of manufacturing the differential signal line group and the ground line of the same layer.

Figure 19:
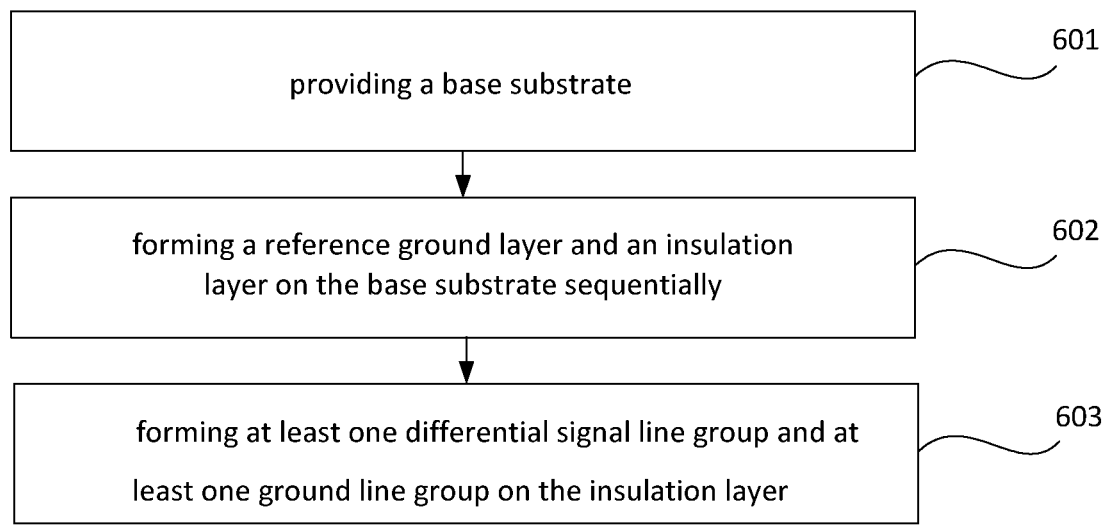
FIG. 19 is a flow chart showing another method for manufacturing a functional panel according to an exemplary embodiment.

Since there are various structures of the functional panel, please refer to FIG. 19. FIG. 19 provides a method for manufacturing a functional panel, e.g. for manufacturing the functional panel shown in FIG. 10. The method comprises:

step 601: providing a base substrate, optionally the base substrate being made of glass or organic material; and step 602: forming a reference ground layer and an insulation layer on the base substrate sequentially.

In an optional implementation, the reference ground layer is a whole-layer structure, and the reference ground layer can be formed on the base substrate through a process such as coating or sputtering. In another optional implementation, the reference ground layer is a patterned structure, a conductive film layer can be formed on the base substrate through a process such as coating or sputtering, and one patterning process is performed to the conductive film layer to obtain the reference ground layer. The manufacturing material of the reference ground layer can be a conductive material such as metal or carbon.

After the reference ground layer is formed, an insulation layer may be formed on the reference ground layer through a process such as coating or sputtering. The insulation layer may be made of an inorganic material.

The method may further comprise a step 603: forming at least one differential signal line group and at least one ground line group on the insulation layer.

In an exemplary embodiment, after a plurality of vias are formed in the insulation layer (the plurality of vias correspond to the positions of the ground line groups to be formed), the plurality of vias in the insulation layer are filled with a conductive material. The conductive material may be the same as or different from the manufacturing material of the ground line. Then a conductive material layer is formed on the insulation layer, and one patterning process is performed to the conductive material layer to form a ground line group with vias. That is, the ground line groups and vias are manufactured through one patterning process.

In another exemplary embodiment, after forming a plurality of vias in the insulation layer, a conductive ground layer can be formed on the insulation layer. Since the ground layer is directly covered on the insulation layer, the ground layer covering the plurality of vias described above is provided with a plurality of vias, respective one of which corresponds to respective one of the plurality of vias in the insulation layer. Then one patterning process is performed to the ground layer to form a ground line group. The finally formed at least one ground line group is connected to the reference ground layer through a plurality of vias in the insulation layer.

It should be noted that, in the above manufacturing method, one patterning process may comprise photoresist coating, exposure, development, etching, and photoresist stripping.

It is noted that, for the method of manufacturing other structures of the functional panel, reference may be made to the above manufacturing method, and for the relevant structures in the manufacturing method in the embodiment of the present disclosure, reference may be made to the foregoing device embodiments, which are not described in the exemplary embodiment.

It should be noted that in the drawings, the dimensions of layers and regions may be exaggerated for clarity of illustration. It will also be understood that when an element or layer is referred to as being "on" another element or layer, it can be directly on the other element or layer or intervening layers may be present. In addition, it can be understood that when a layer or element is referred to as being "between" two layers or two elements, it can be the only layer or element between the two layers or two elements, or one or more intervening layers or elements may also be present. Similar reference numerals indicate similar elements throughout.

Those skilled in the art will readily contemplate other embodiments of the present disclosure after considering the description and practicing the invention disclosed herein. This application is intended to cover any variations, uses, or adaptations of this disclosure that conform to the general principles of this disclosure and comprise the common general knowledge or conventional technical means in the technical field not disclosed by this disclosure. It is intended that the description and embodiments are considered as exemplary only, and a true scope and spirit of the disclosure are indicated by the following claims.

It should be understood that the present disclosure is not limited to the precise structures that have been described above and illustrated in the accompanying drawings, and various modifications and changes may be made without departing from the scope thereof. The scope of the disclosure is limited only by the following claims.

The invention claimed is:

1. A functional panel comprising:
   a base substrate;
   at least one differential signal line group on the base substrate, and each differential signal line group of the at least one differential signal line group comprising two signal lines on a same side of the base substrate;
   at least one ground line group on the base substrate and on the same side of the base substrate as the at least one differential signal line group, each ground line group of the at least one ground line group comprising two ground lines;
   wherein each ground line group corresponds to each differential signal line group one-to-one, and orthographic projections of the two ground lines in each ground line group on the base substrate are on both sides of an orthographic projection of a corresponding differential signal line group on the base substrate, and two ground lines in the ground line group are connected to a same reference ground,
   wherein the functional panel further comprises:
   a reference ground layer and an insulation layer sequentially stacked in a direction away from the base substrate;
   wherein the at least one ground line group is on a side of the insulation layer away from the reference ground layer, a plurality of vias are provided in the insulation layer, and the at least one ground line group is connected to the reference ground layer through the plurality of vias in the insulation layer,
   wherein at least one via is provided in each of the two ground lines in each ground line group, the at least one via is configured to connect to the reference ground and respective one of the at least one via corresponds with respective one of the plurality of vias in the insulation layer,
   wherein the two ground lines in the ground line group comprise a first ground line and a second ground line, the first end of the first ground line and the first end of the second ground line are connected through a first lead, and the first lead is connected to the reference ground layer through the plurality of vias in the insulation layer; and the first end and the second end are two opposite ends in the extending direction of the first ground line or the second ground line.

2. The functional panel according to claim 1, wherein the at least one differential signal line group comprises a plurality of differential signal line groups arranged in an array, and the at least one ground line group comprises a plurality of ground line groups arranged in an array, and two adjacent ground line groups of the plurality of ground line groups multiplex a same ground line.

3. The functional panel according to claim 1, wherein the at least one via comprises a plurality of vias arranged at equal intervals.

4. The functional panel according to claim 1, wherein the second end of the first ground line and the second end of the second ground line are connected through a second lead, and the second lead is connected to the reference ground layer through the plurality of vias in the insulation layer; and the first end and the second end are two opposite ends in the extending direction of the first ground line or the second ground line.

5. The functional panel according to claim 1, further comprising:
   at least one bonding pad;
   at least one driver chip;
   wherein the at least one bonding pad is connected to the at least one driver chip through the at least one differential signal line group, at least one ground line group is between the at least one bonding pad and the at least one driver chip, and respective one of the at least one ground line group corresponds to respective one of the at least one differential signal line group.

6. The functional panel according to claim 5, wherein each driver chip of the at least one driver chip comprises:
   one ground pad and two signal pads, and
   wherein the ground pad is on a side of the two signal pads, and the two signal pads are configured to be respectively connected to two signal lines in a corresponding differential signal line group, and
   wherein the first ground line is directly connected to the ground pad.

7. The functional panel according to claim 6, wherein the second ground line is connected to the ground pad through a third lead that is insulated from both the two signal lines, and an orthographic projection of the third lead on the base substrate crosses orthographic projections of the two signal lines on the base substrate.

8. The functional panel according to claim 5,
   wherein each driver chip comprises a first ground pad, a second ground pad, and two signal pads, and
   wherein the first ground pad and the second ground pad are on both sides of the two signal pads, respectively, and the two signal pads are configured to be respectively connected to two signal lines in a corresponding differential signal line group, and
   wherein the first ground line is connected to the first ground pad, and the second ground line is connected to the second ground pad.

9. The functional panel according to claim 7, wherein the third lead is on a side of the differential signal line group away from the base substrate and laps over the two signal lines, and an insulating spacer is provided at a lap-joint between the third lead and the two signal lines.

10. The functional panel according to claim 7, wherein the third lead and the ground line group are at different layers, and an isolation layer for insulation is provided between the third lead and the ground line group, and both ends of the third lead are connected to the first ground line and the second ground line through vias in the isolation layer, respectively.

11. The functional panel according to claim 1, wherein the at least one differential signal line group and the at least one ground line group are at a same layer on the base substrate.

12. The functional panel according to claim 1, wherein the base substrate is made of glass or organic material; and
   the functional panel comprises a display panel, a touch panel, or an in-cell touch display panel.

13. The functional panel according to claim 1, wherein in each differential signal line group of the at least one differential signal line group, two signal lines comprise a first signal line and a second signal line, each of the first signal line and the second signal line comprises a first segment and a second segment, the first segment of the first signal line is parallel to the first segment of the second signal line, and the second segment of the first signal line is parallel to the second segment of the second signal line,
   a ratio of a distance between the first segment of the first signal line and the first segment of the second signal line to a line width at a corresponding position of the first segment of the first signal line or the first segment of the second signal line equals to a ratio of a distance between the second segment of the first signal line and the second segment of the second signal line to a line width at a corresponding position of the second segment of the first signal line or the second segment of the second signal line, and the ratio is constant in extending directions of the first segment and the second segment.

14. A terminal comprising the functional panel according to claim 1.

15. A method for manufacturing a functional panel, comprising:

providing a base substrate;

forming at least one differential signal line group and at least one ground line group on a same side of the base substrate;

wherein each ground line group of the at least one ground line group corresponds to each differential signal line group of the at least one differential signal line group one-to-one, each differential signal line group comprises two signal lines, each ground line group comprises two ground lines, orthographic projections of the two ground lines in each ground line group on the base substrate are on both sides of an orthographic projection of a corresponding differential signal line group on the base substrate, and two ground lines in the ground line group are connected to a same reference ground, wherein the functional panel further comprising:

a reference ground layer and an insulation layer sequentially stacked in a direction away from the base substrate;

wherein the at least one ground line group is on a side of the insulation layer away from the reference ground layer, a plurality of vias are provided in the insulation layer, and the at least one ground line group is connected to the reference ground layer through the plurality of vias in the insulation layer, wherein at least one via is provided in each of the two ground lines in each ground line group, the at least one via is configured to connect to the reference ground and respective one of the at least one via corresponds with respective one of the plurality of vias in the insulation layer, wherein the two ground lines in the ground line group comprise a first ground line and a second ground line, the first end of the first ground line and the first end of the second ground line are connected through a first lead, and the first lead is connected to the reference ground layer through the plurality of vias in the insulation layer; and the first end and the second end are two opposite ends in the extending direction of the first ground line or the second ground line.

\* \* \* \* \*